United States Patent
Tauzin

(10) Patent No.: US 8,021,959 B2
(45) Date of Patent: Sep. 20, 2011

(54) METHOD FOR THE ULTRASONIC PLANARIZATION OF A SUBSTRATE, FROM ONE SURFACE OF WHICH A BURIED WEAKENED LAYER HAS BEEN UNCOVERED BY FRACTURE

(75) Inventor: Aurelie Tauzin, Saint Egreve (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 0 days.

(21) Appl. No.: 12/889,180

(22) Filed: Sep. 23, 2010

(65) Prior Publication Data

US 2011/0076836 A1    Mar. 31, 2011

(30) Foreign Application Priority Data

Sep. 25, 2009 (FR) ..................... 09 56661

(51) Int. Cl.
*H01L 21/30* (2006.01)
(52) U.S. Cl. ........ 438/455; 438/456; 438/458; 438/459; 257/E21.568; 257/E21.57
(58) Field of Classification Search .................. 438/455, 438/456, 458, 459; 257/E21.568, E21.57
See application file for complete search history.

(56) References Cited

U.S. PATENT DOCUMENTS

| 5,837,662 | A | 11/1998 | Chai et al. |
| 6,830,648 | B2 * | 12/2004 | Wang et al. ................... 156/344 |
| 7,645,392 | B2 * | 1/2010 | Maunand Tussot et al. .... 216/33 |
| 2001/0055854 | A1 | 12/2001 | Nishida et al. |
| 2002/0020053 | A1 * | 2/2002 | Fonash et al. ............... 29/623.1 |

FOREIGN PATENT DOCUMENTS

| EP | 1 427 001 A1 | 6/2004 |
| EP | 1 427 002 A1 | 6/2004 |

OTHER PUBLICATIONS

French Preliminary Search Report, dated Jun. 16, 2010—(2 pgs).
Jiang et al., "Effect of Roughness and Wettability of Silicon Wafer in Cavitation Erosion" published in *Chinese Science Bulletin*/Sep. 2008, vol. 53/n°18/pp. 2879-2885).

* cited by examiner

*Primary Examiner* — Hsien Ming Lee
(74) *Attorney, Agent, or Firm* — Brinks Hofer Gilson & Lione

(57) ABSTRACT

A method for forming a plurality of thin films from a microtechnological donar substrate with a view to recycling of the donor substrate, the method including exposing a face of the donor substrate by fracturing the donor substrate along a layer weakened by implantation and placing the exposed face in a bath and applying ultrasound with a frequency of between 10 kHz and 80 kHz under conditions suitable for causing cavitation along the exposed face. In the case of a silicon donor substrate, the bath is exposed to an ultrasound power per unit volume of greater than 5 W/I, at a power of greater than 10 W with a duration of greater than 1 minute, and at a temperature between 1° C. and 100° C.

10 Claims, 2 Drawing Sheets

METHOD FOR THE ULTRASONIC PLANARIZATION OF A SUBSTRATE, FROM ONE SURFACE OF WHICH A BURIED WEAKENED LAYER HAS BEEN UNCOVERED BY FRACTURE

RELATED APPLICATIONS

This application claims the benefit of priority to French Patent Application No. 0956661, filed Sep. 25, 2009, which is incorporated by reference herein.

FIELD OF INVENTION

In the field of microtechnology or nanotechnology, the invention concerns the treatment of a surface of a substrate exposed by fracture along a previously weakened layer, with a view to improving the planarity, in particular by detaching possible residues of material resulting from local fracture defects.

It relates in particular to the case of preparing a face of a donor substrate, exposed during a cycle of forming a thin layer by ion implantation then fracture, with a view to a new cycle of forming a new thin layer.

It is to be recalled that the substrates used in microtechnology (or nanotechnology) typically consist of silicon, optionally alloyed with germanium, or alloys of materials in columns III-V or II-VI of the periodic table of elements.

BACKGROUND

The formation of thin layers from a donor substrate is a conventional step in microtechnology. Among the main techniques for such formation, the method known by the name "Smart Cut™" may be mentioned.

The method "Smart Cut™" makes it possible to detach a thin film and transfer it onto a stiffener by the following steps:
1. bombarding a face of a donor substrate with gas species (H or a rare gas) in order to implant these ions in a sufficient concentration to cause the creation of a buried layer weakened by the presence of microcavities,
2. placing this face of the substrate in intimate contact with a stiffener and
3. fracturing the layer of microcavities by applying a heat treatment and/or a detachment stress (for example inserting a blade between the two substrates and/or traction and/or flexion and/or shear forces, and/or the application of ultrasound or microwaves with an expediently selected power and frequency).

Conventionally, in order to form a plurality of thin layers from such a donor substrate, the remainder of the substrate obtained at the end of a cycle is recycled by using this remainder as the donor substrate for a new cycle of steps 1-3 above. Thus, using the same donor substrate, a plurality of thin films are transferred onto different stiffeners.

In practice, the thickness of the thin layer (the term thin film is sometimes used) is so small, typically less than a few microns, that its detachment from the donor substrate resembles peeling.

In fact, the presence of a stiffener is not always required; in particular, a stiffener may be omitted when the thickness of the thin layer is sufficient for it to be self-supporting. In other words, the presence of a stiffener serves mainly to facilitate the handling of a thin layer which has just been detached from a donor substrate.

However, with the trend to constantly reduce the thickness of thin layers, the presence of a handle substrate (used for stiffening or handling) is more and more desirable.

It will be understood that the remainder obtained by applying an aforementioned cycle to a donor substrate can be recycled only on condition that the surface of the face uncovered during the preceding cycle has a sufficient quality to allow it to be fixed to a new handle substrate.

For various reasons, however, the step of fracture along the buried weakened layer leads to detachment of only a part of the thin film; this is because the film locally remains integral with the donor substrate in zones referred to as non-transferred zones, thus forming elevations with a thickness varying between 10 and 1000 nm (in general substantially equal to the thickness of the thin film). Recycling of the donor substrate then requires particular steps of planarization by mechanical polishing and/or chemical attack.

The existence of such non-transferred zones is due to the fact that, ideally, step 2 of placing the donor substrate (previously implanted) in intimate contact with the stiffener should be carried out on plane and perfectly clean surfaces. The problem is that, when carrying it out, this intimate contacting cannot be achieved over the entire surface of the substrates:
1) first, the donor substrate (as well as the handle substrates forming stiffeners) are typically wafers whose edges are chamfered. This problem of wafer edge non-bonding is encountered for all the materials used in microtechnology (Si, Ge, GaAs, GaN, sapphire, SiGe, LiTaO$_3$, LiNbO$_3$, SiC, InP, and the like) and for all wafer diameters (typically from 5 cm to 30 cm, in particular from 2 to 12 inches),
2) furthermore, in the case of substrates or layers which are structured intentionally (for example with hollow/relief patterns produced by photolithography) or unintentionally (for example by growth defects in the case of epitaxial layers, or by defects associated with the deposition of a layer on the initial substrate), the patterns or defects "hollowed" on the surface locally give rise to non-bonded zones (abbreviated to NBZ),
3) lastly, in the event of ineffective cleaning, the presence of particles on the bonding surface also gives rise to non-bonded zones.

During the fracture step, when the dimension of the NBZs is large compared with the thickness of the film to be transferred (for example a ratio [lateral NBZ dimension]/[film thickness] of the order of 10), the thin film locally remains integral with the initially implanted substrate. These are referred to as non-transferred zones (abbreviated to NTZ).

FIG. 1 schematically represents a donor substrate 1 which is attached by molecular adhesion to a handle substrate 2.

The bonding of the two substrates 1 and 2 is carried out by means of bonding layers 11 and 21 formed on the free faces of the two substrates.

These two substrates (here "wafers") are chamfered at their peripheries denoted 12 and 22. Furthermore, as a consequence of cleaning which has not been completely effective, a particle 3 is trapped in the interface S between the bonding layers so that, at the position of this particle, the two substrates are not bonded to one another (of course, depending on the materials selected for the two substrates, it is possible to omit the bonding layers); in the example considered, the two substrates are made of silicon and the bonding layers are made of silicon oxide (this may involve the thermal oxide layer naturally present on the surface of the substrate, but it may also involve a thicker layer formed intentionally).

The donor substrate has been weakened beforehand by implanting gas species in a layer 13 buried at a depth, under the surface belonging to the interface, which determines the thickness of the future thin layer which is intended to be transferred from the donor substrate to the handle substrate; the reference 14 denotes the layer lying between the buried layer and the bonding interface, detachment of which will give the thin layer.

FIG. 2 schematizes the fact that, owing to the lack of bonding at the edges of the substrates (because they are chamfered) and at the position of the particle, the layer 14 is not detached everywhere from the donor substrate 1: there remain edge portions A and A' and an island B, corresponding to the position of the particle. In these FIGS. 1 and 2, of course, the thickness of the layer 14 is highly exaggerated in comparison with the dimensions of the particles or chamfered edges.

In practice, these non-bonded zones lead to very local lifting or detachment (over dimensions of a few $\mu m^2$) of the thin layer, in the form of blisters or exfoliated zones.

The dimensions of the non-transferred zones depend not only on the dimensions of the non-bonded zones but also on the adhesion force (this force depends in particular on the properties of the surfaces placed in contact, but also on the operating conditions of a possible heat treatment during or after the implantation).

FIG. 2 clearly demonstrates the need, for recycling, to provide a treatment of the surface of the substrate which has been uncovered by detaching the layer 14 in order to give the thin layer 4, this treatment aiming to planarize this surface in order to eliminate the elevations formed by the non-transferred zones from it.

Examples of planarization steps are described particularly in the published European Patent Application Nos. EP1427002 and EP1427001 in relation to the periphery of the substrates where a neck remains, consisting of the peripheral part of the layer which has to form the thin layer. It is thus recommended, in particular, to apply a planarization treatment localized at the periphery, comprising polishing or the application of a mechanical pressure, or a selective chemical attack or an ion attack (for example by an ion beam). As a variant, it is recommended to separate the neck by spraying a jet of fluid onto this neck, or by projecting a laser beam onto this neck, preferably parallel to the exposed surface, or by applying a shock wave to the rear face of the substrate. This treatment localized at the periphery may be followed by a planarization treatment applied to the entire surface.

It will, however, be understood that such localized treatments may be complex to carry out.

SUMMARY

It is an object of the invention to provide a method for planarizing surfaces exposed by fracture of weakened layers within a donor substrate, with the possible formation of elevations remaining on the surfaces, which is simple to carry out without requiring localized treatment and which, on the contrary, can be carried out on a plurality of such substrates simultaneously if this is expedient.

To this end, the invention provides a method for planarizing a microtechnological substrate having a face uncovered by fracture along a layer weakened by implantation, according to which this face is placed in a bath and ultrasound with a frequency of between 10 kHz and 80 kHz is applied therein under conditions suitable for causing cavitation along said face.

In practice, for most materials commonly used in microtechnology (miniaturization is even leading to the use of the term nanotechnologies), the ultrasound application conditions moreover advantageously comply with the following conditions:
1) ultrasound power/volume of the bath >5 W/l
2) power >10 W
3) duration >1 min
4) temperature between 1° C. and 100° C.

It will readily be understood that the duration of the treatment can be reduced commensurately when the power is higher. There is moreover an optimal temperature such that the viscosity of the liquid used in the ultrasound bath is minimal while avoiding boiling (for water, this temperature lies between 40 and 60° C.).

The fluid conducting the ultrasound is preferably selected so as to have a low viscosity, in order to promote stripping of the surface by cavitation. Thus, water will advantageously be used. The fluid may also consist of a solution that preferentially etches the material which constitutes the exposed surface and comprises the damage to be smoothed (such a fluid may be of the type Secco, Wright).

It should be noted that selecting water as the fluid for the cavitation bath equates to selecting a cavitation fluid which, in contrast to what is most often carried out in conventional cavitation baths, does not add any chemical or electrostatic effect to the effect of the cavitation per se.

The way to carry out cleaning of certain surfaces by ultrasound is in fact already understood, but it is also known that the phenomenon of cavitation which is involved in this cleaning by ultrasound can, under certain conditions, induce damage to the surface, the effect of which is that the damage by cavitation has been a detrimental effect which the users of ultrasound have sought to avoid as being detrimental (see, for example, the article "Effect of roughness and wettability of silicon wafer in cavitation erosion" by Jiang, Liu & Chen, published in Chinese Science Bulletin/September 2008/vol 53/n° 18/pp 2879-2885).

For the application to which the present invention relates, however, it has surprisingly been observed that under certain conditions the ultrasound makes it possible to eliminate the residual non-transferred zones (NTZ) which may exist after a fracture treatment of a buried weakened zone (resulting for example from the "Smart Cut™" method), without degrading the rest of the surface. Although the effect of the cavitation due to the ultrasound is generally considered to be directed towards the surface, it seems that this effect can also take place along it so as to detach the NTZs, even before substantial damage to the surface itself is produced. This phenomenon may be due to greater cavitation on the surface roughness (NTZ): thus, it has been observed that the rougher the surface is, the more nucleation sites for the cavitation bubbles there will be, and therefore the stronger the effect of the ultrasound will be.

In addition to the fact that the person skilled in the art has thus been dissuaded from using cavitation, it should be noted that even though such cavitation can be analyzed as involving the formation of a multitude of shock waves (see below) as the bubbles burst under pressure, this is a phenomenon fundamentally different to the application of one (or more) shock wave(s) applied to the rear surface of a substrate, as mentioned in the published European Patent Application No. EP-1 427 002 cited above (apparently outside any bath) in order to remove a residual collar of material; indeed, it will be understood that the many shock waves generated in a disordered fashion by cavitation very close to the surface to be planarized, and all along it, have effects very different from those of a macroscopic shock wave applied in a controlled way to the entire substrate, through a face on the opposite side from the face of interest.

One of the features of the invention consisted in recognizing that there were conditions under which such cavitation could be exploited, contrary to the prejudices of the person skilled in the art, for usefully treating all of a surface exposed by fracture.

This method makes it possible to recycle the donor substrate directly after fracture/cavitation, or after a simplified surface treatment such as chemical-mechanical polishing carried out after the cavitation.

The donor substrate treated in this way may then be subjected to various processing operations to form microtechnological components (microelectronic or micromechanical or microoptical components or sensors, and the like). Nevertheless, the invention is more particularly suitable for the case in which the donor substrate is subjected to other fracture cycles along buried weakened layers, in particular according to the "Smart Cut™" technology.

Thus, the invention provides in particular a method for forming a plurality of thin layers from a microtechnological donor substrate, according to which cycles comprising the following steps are carried out:

1) a buried weakened layer is formed by ion implantation below a free face of this donor substrate, the material thickness contained between this free face and the buried weakened layer defining the thickness of a future thin layer,
2) this donor substrate is placed in intimate contact with a handle substrate by molecular adhesion between this free face of the donor substrate and a free face of this handle substrate,
3) a fracture is induced along this buried weakened layer so as to release said thin layer from a remainder of the donor substrate, while exposing respective faces of this thin layer and this remainder,
4) a treatment is applied to said exposed face of the remainder of the donor substrate with a view to a new cycle for which this remainder constitutes the donor substrate,
5) characterized in that said treatment of said exposed face comprises placing this exposed face in a bath in which ultrasound with a frequency of between 10 kHz and 80 kHz is applied under conditions suitable for causing cavitation along said face.

As before, the ultrasound is preferably applied under the following conditions:

1) ultrasound power/volume of the bath >5 W/l
2) power >10 W
3) duration >1 min
4) temperature between 1° C. and 100° C.

According to other advantageous characteristics of the invention, which may optionally be combined:

1) the frequency of the ultrasound is selected between 10 kHz and 40 kHz with a power of between 5 W/l and 60 W/l (for example more than 20 W/l),
2) the duration of the ultrasound treatment is between 1 min and 20 h (for example more than 1 hour),
3) the buried weakened layer is formed by hydrogen ion implantation, with a dose of between $10^{16}$ ions·cm$^2$ and $5 \times 10^{17}$ ions·cm$^2$,
4) the fluid of the bath is water (or essentially formed by water),
5) the fluid of the bath is a mixture of water and acetone (the quantity of acetone may be low enough that the bath can be considered to be essentially formed by water),
6) the temperature of the bath is between 40° C. and 60° C.,
7) the step of placement in a bath in which ultrasound is applied under conditions suitable for causing cavitation along said face is carried out without an intermediate surface treatment after the fracture step; it is therefore the exposed surface which is subjected to the ultrasound, exactly in the state resulting from the fracture,
8) recycling of the donor substrate without an intermediate treatment is carried out after the step of placement in a bath in which said ultrasound is applied; this has a particularly simple version of the invention; however, a simplified surface treatment of such a simple chemical-mechanical polishing may be envisaged between the application of the ultrasound and the start of a new cycle,
9) the step of placement in a bath in which ultrasound is applied under conditions suitable for causing cavitation is carried out collectively for the respective faces of a plurality of substrates exposed by such a fracture step.

The invention is more particularly suitable for donor substrates made of silicon (or formed by silicon in their part intended to form the surface to be planarized).

BRIEF DESCRIPTION OF DRAWING

Objects, characteristics and advantages of the invention may be found in the following description, which is given by way of nonlimiting illustration and with reference to the appended drawings, in which.

DETAILED DESCRIPTION

Figure 1:
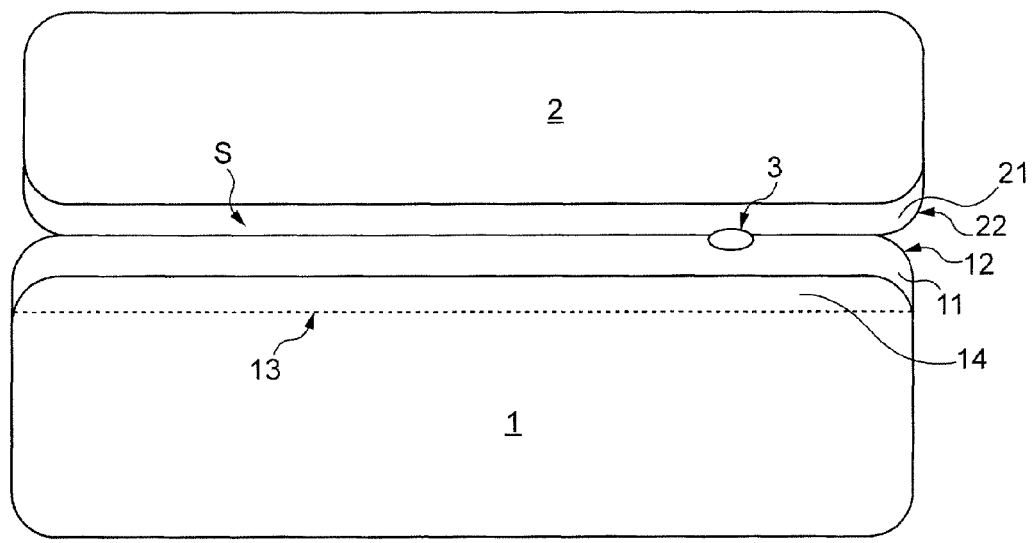
FIG. 1 is a schematic view of a donor substrate bonded to a handle substrate after the formation of a buried weakened layer.

The invention provides a method for planarizing a surface exposed by fracture of a buried weakened layer, in particular for recycling a substrate after transfer of layers by the "Smart Cut™" technology, based on the application of ultrasound selected expediently as a function of the materials present so as to cause damage by cavitation, which is more particularly localized on the residues to be eliminated but without thereby generating substantial damage to the rest of the exposed surface, in particular using a frequency of between 10 kHz and 80 kHz. The conduct of this planarization step is schematized in FIG. 3, with the exposed surface 5 damaged by the fracture along the buried layer 3 (according to FIGS. 1 and 2 in a manner known per se) being placed in contact with a bath 6 in which ultrasound denoted by the reference US is generated.

By way of example, the buried weakened layer is formed by implanting hydrogen with a dose of between $10^{16}$ ions·cm$^2$ and $5 \times 10^{17}$ ions·cm$^2$.

Particularly in the event that the material forming the substrate below the surface 5 is silicon (which corresponds to a situation of great practical importance), the applied ultrasound respectively complies with the following conditions:

ultrasound power/volume of the bath >5 W/l (preferably at least equal to 20 W/l or even 30 W/l, preferably at most equal to 60 W/l), power >10 W, duration >1 min (preferably at least equal to 1 h), temperature between 1° C. and 100° C., for example at room temperature or between 40° and 60° C.

The fluid conducting the ultrasound preferably has a low viscosity, in order to promote stripping of the surface by cavitation. Thus, water will advantageously be used, or water to which acetone has been added in order to reduce its viscosity (preferably in an amount such that the fluid of the bath can be considered to be essentially formed by water). The fluid may also consist of a solution which preferentially etches the damaged Si (of the type Secco, Wright).

It is to be recalled that the mechanism of cleaning (like the mechanism of damage) by ultrasound is based on a cavitation effect, with the creation and implosion of bubbles formed when a liquid is subjected to a periodic pressure wave. More precisely:

vapor bubbles are formed at low pressure, owing to the high pressure in the liquid surrounding the bubble, it tends to contract while increasing its internal pressure and internal temperature, when a critical size is reached, a very violent implosion mechanism takes place, which causes an acoustic shock wave (the internal pressure may reach several thousand K and the pressure may reach several hundreds of atmospheres, and this can result in the formation of jets whose velocity can amount to multiples of 400 km/h, this implosion of the cavitation bubbles along a solid surface causes cleaning, or stripping, or even local rupture by fatigue, whence local detachment and possibly exfoliation of the material.

It will be understood that cavitation is regarded as detrimental owing to the damage which it causes, and that there is great reluctance on the part of the person skilled in the art to employ ultrasound on a surface whose surface condition should have as low a roughness as possible.

It has however surprisingly been observed that, under certain conditions selected as a function of the nature of the substrates, ultrasound makes it possible to remove the residual NTZs which may result from a layer transfer method such as the "Smart Cut™" method, without degrading the rest of the surface.

The step of placing the exposed surface in a bath in which the cavitation is generated preferably takes place without any intermediate step of surface treatment after fracture, even a slight one; the reason is that this cavitation is advantageously carried out on the exposed surface in the actual state which results from the fracture.

Figure 2:
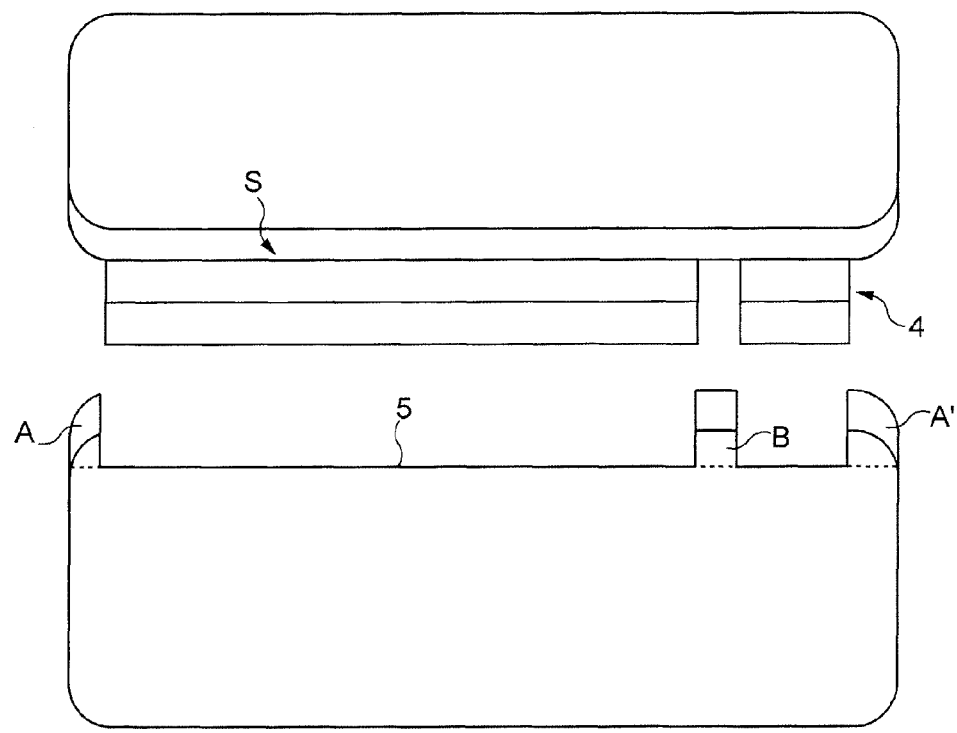
FIG. 2 is a schematic view of the assembly after fracture along the buried weakened layer.
Figure 3:
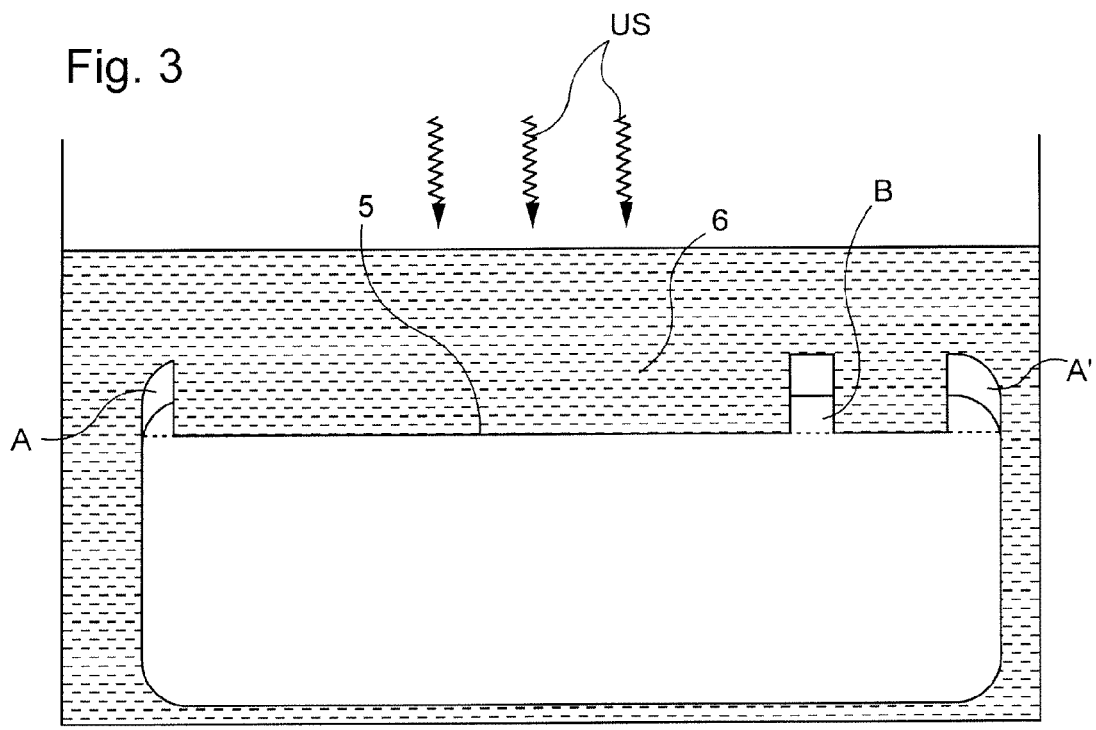
FIG. 3 is a schematic view of the planarization treatment of the invention.
Figure 4:
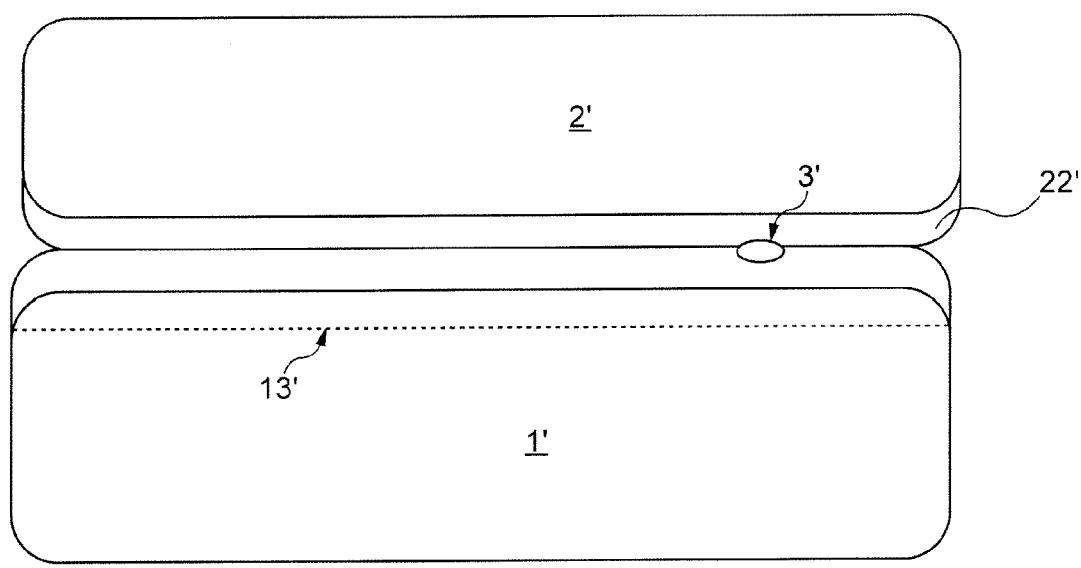
FIG. 4 is a schematic view of the remainder of the donor substrate at the end of the step in FIG. 3 during a new cycle of transferring a layer of this donor substrate.

Thus, with the remainder of the substrate 1 whose layer 14 has been detached, a new donor substrate 1' is obtained to which (see FIG. 4) the same steps can be applied as in FIGS. 1 and 2 with the formation of a buried weakened region, bonding to a handle substrate, and detachment of a new layer 14' by fracture.

Advantageously, the donor substrate is recycled without an intermediate treatment after the step of placement in a bath in which said ultrasound is applied.

Also advantageously, the step of placement in a bath in which ultrasound is applied under conditions suitable for causing cavitation is carried out collectively for the respective faces of a plurality of substrates exposed by such a fracture step.

This recycling process has numerous advantages:

1) it makes it possible to clean items which may have a wide variety of sizes and geometries, 2) the detached particles are naturally dispersed and do not run the risk of being redeposited on the surface, 3) this planarization by ultrasound is a faster cleaning process than the conventional processes, 4) when the choice is made to use a solvent, this may be used in a much less concentrated way than when this solvent is used for conventional planarization, 5) the ultrasonic treatment allows electronic control and therefore automation, whence improved stability and reproducibility compared with known processes, 6) the substrates can be processed collectively and inexpensively, which is particularly beneficial for its industrialization, notably for photovoltaic applications, and the like.

EXAMPLE 1

In a first example, an Si substrate covered with an Si oxide with a thickness of 400 nm is implanted with $H^+$ ions under the following conditions:

1) energy=76 keV, 2) dose=$6 \times 10^{16}$ ions·cm$^{-2}$.

The Si substrate is subsequently bonded by molecular adhesion onto an Si stiffener. The fracture is then induced in the implanted layer by a heat treatment at 450° C. for 1 h. A part of the implanted Si film is transferred onto the Si stiffener substrate, so as to obtain an SOI structure (silicon on insulator) which can be used for example for the production of microelectronic components. Another part localized on the collar of the Si substrate remains integral with the implanted substrate and exhibits surface deformations of the blister type.

Applying 20 kHz ultrasound with a power of 30 W/l to the surface of the donor substrate exposed by the fracture for 16 h in water makes it possible to eliminate the residual blisters and therefore suppress the pronounced elevations existing on the peeled substrate (elevations with a height of 760 nm corresponding to the transferred film). Slight polishing may then be applied in order to reduce the fracture roughness observed after transfer. The substrate is then ready for a new cycle.

EXAMPLE 2

In a second example, a crystalline GaN substrate ($^{70}$Ga$^{14}$N) is covered with an $SiO_2$ bonding layer with a thickness of 500 nm, deposited by LPCVD (Low Pressure Chemical Vapor Deposition) at 900° C. This substrate is implanted with $H^+$ ions under the following conditions:

1) energy=90 keV, 2) dose=$4^E17$ ions·cm$^{-2}$.

The GaN with the bonding layer is subsequently bonded by molecular adhesion onto a sapphire substrate. The fracture is subsequently induced in the implanted layer by a heat treatment at 220° C. The step of 220° C. fracture leads to detachment of a GaN film with a thickness of about 480 nm and the 500 nm $SiO_2$ bonding layer over the majority of the implanted GaN substrate. A part of the GaN film is transferred onto the sapphire substrate, and a GaN/$SiO_2$/sapphire structure is obtained which can be used for example of the production of an LED. Another part located on the collar of the GaN substrate remains integral with the substrate in the form of blisters. The initially implanted GaN substrate can then be recycled, without any surface treatment after fracture, for other transfers after an ultrasonic treatment as follows: 40 kHz with a power per unit volume of 60 W/l for 1 h in a mixture of water/acetone (acetone has the benefit of making it possible to reduce the viscosity and therefore promote the cavitation).

Simple resurfacing by CMP (for example, a few seconds of polishing) may optionally be applied in order to eliminate the roughness associated with the fracture before a new cycle.

The invention claimed is:

1. A method for forming a plurality of thin layers from a microtechnological donor substrate, the method comprising cycles including:
    forming a buried weakened layer by ion implantation below a free face of the donor substrate, the material thickness contained between the free face and the buried weakened layer defining a thickness of a thin layer;
    placing the donor substrate in intimate contact with a handle substrate by molecular adhesion between the free face of the donor substrate and a free face of the handle substrate;
    inducing a fracture along the buried weakened layer so as to release the thin layer from a remainder of the donor substrate, while exposing respective faces of the thin layer and the remainder of the donor substrate;
    treating the exposed face of the remainder of the donor substrate such that the remainder constitutes a new donor substrate,
    wherein treating the exposed face comprises planarizing the exposed face of the remainder of the donor substrate by placing the exposed face in a bath and applying ultrasound at a frequency of between 10 kHz and 80 kHz, and under bath conditions suitable for causing cavitation along the exposed face and for a time duration that eliminates residual non-transferred zones on the exposed face after inducing the fracture and without substantially degrading the exposed face, so as to form a planarized exposed face.

2. The method according to claim 1, wherein forming the buried weakened layer comprises hydrogen ion implantation with a dose between $10^{16}$ ions/cm$^2$ and $5 \times 10^{17}$ ions/cm2.

3. The method according to claim 1 or claim 2, wherein applying ultrasound comprises applying ultrasound power per unit volume of the bath of greater than 5 W/l, at a power of greater than 10 W with a duration of greater than 1 minute, and a temperature between 1° C. and 100° C.

4. The method according to claim 1, wherein placing the exposed face in a bath comprises placing the exposed face in a bath comprising water.

5. The method according to claim 1, wherein placing the exposed face in a bath comprises placing the exposed face in a bath comprising a mixture of water and acetone.

6. The method according to claim 1, wherein applying ultrasound comprises applying a frequency of between 10 kHz and 40 kHz with a power/volume of the bath of between 5 W/l and 60 W/l, and a treatment duration of between 1 minute and 20 hours.

7. The method according to claim 1, wherein treating the exposed face of the remainder of the donor substrate by placing the exposed face in a bath in which ultrasound is applied under conditions suitable for causing cavitation along the exposed face is carried out in the absence of any additional intermediate surface treatment after the fracture step.

8. The method according to claim 1, further comprising recycling the donor substrate by repeating the method of claim 1, wherein the recycling is carried out in the absence of any additional intermediate surface treatment of the exposed face of remainder of the donor substrate.

9. The method according to claim 1, wherein treating the exposed face of the remainder of the donor substrate comprises collectively treating respective exposed faces of a plurality of donor substrates after inducing a fracture along the buried weakened layer.

10. The method according to claim 1, wherein in the donor substrate comprises silicon.

* * * * *